United States Patent [19]
Cho

[11] Patent Number: 5,923,954
[45] Date of Patent: Jul. 13, 1999

[54] BALL GRID ARRAY PACKAGE AND FABRICATION METHOD THEREFOR

[75] Inventor: Jae-Won Cho, Choongcheongbuk-Do, Rep. of Korea

[73] Assignee: LG Semicon Co., Ltd., Cheongju, Rep. of Korea

[21] Appl. No.: 09/023,286

[22] Filed: Feb. 13, 1998

[30] Foreign Application Priority Data

Mar. 14, 1997 [KR] Rep. of Korea .......................... 97-8655

[51] Int. Cl.⁶ .............................. H01L 21/44; H01L 21/48
[52] U.S. Cl. ..................... 438/108; 438/106; 438/127; 257/738; 361/764
[58] Field of Search ................................. 438/106, 108, 438/127, 119; 257/738, 673, 690, 701, 790, 787, 678; 361/764, 760, 767, 772, 777

[56] References Cited

U.S. PATENT DOCUMENTS

| | | |
|---|---|---|
| 5,355,283 | 10/1994 | Marrs et al. ............................... 361/760 |
| 5,598,036 | 1/1997 | Ho . |
| 5,726,079 | 3/1998 | Johnson et al. . |
| 5,737,191 | 4/1998 | Horiuchi et al. . |
| 5,767,575 | 6/1998 | Lan et al. . |
| 5,861,322 | 1/1999 | Caillat et al. . |
| 5,863,814 | 1/1999 | Alcoe et al. . |
| 5,866,953 | 1/1999 | Akram et al. . |

FOREIGN PATENT DOCUMENTS 8-274425  10/1996  Japan .

*Primary Examiner*—Charles Bowers
*Assistant Examiner*—Martin Sulsky
*Attorney, Agent, or Firm*—Fleshner & Kim

[57] ABSTRACT

A BGA package and a fabrication method therefor are capable of enhancing the productivity of an assembly by eliminating a wire bonding step, which requires a significant amount of time. The package includes a semiconductor chip, connection balls attached to upper surfaces of each of a plurality of chip pads formed on an upper surface of the semiconductor chip, a molding section that exposes upper portions of the connection balls and that packages at least a portion of the semiconductor chip, and solder balls attached to the exposed surfaces of the connection balls. A BGA package embodying the invention is lighter and more compact than related BGA packages. Also, because a wire bonding process is not necessary, it is less expensive to manufacture a BGA package embodying the invention.

7 Claims, 3 Drawing Sheets

BALL GRID ARRAY PACKAGE AND FABRICATION METHOD THEREFOR

BACKGROUND OF THE INVENTION

1. Field of the Invention

The present invention relates to a chip package and a fabrication method therefor, and in particular, to an improved Ball Grid Array (BGA) package a fabrication method therefor.

2. Background of the Related Art

BGA packages are widely used since they make it possible to implement a multiple pin structure in a limited surface area. In addition, since the outer terminals of the BGA package are short, the terminals and package are less likely to be bent due to an externally applied force or impact. Furthermore, it is possible to easily transmit electrical signals in the BGA package. Also, when mounting the package on a mother board, it is possible to reduce the mounting time for the package by using a reflow mounting method which is performed in a furnace for a short time.

FIG. 1 illustrates a related BGA package. As shown therein, the BGA package includes a substrate 1, a semiconductor chip 3 mounted on the upper surface of the substrate 1 by an adhesive 2, metal wires 4 electrically interconnection a plurality of chip pads 3a formed on the upper surface of the chip 3 with circuit patterns (not shown) formed on the substrate 1, a molding section 5 formed on the upper surface of the substrate 1 and encapsulating the chip 3 and metal wires 4, and a plurality of solder balls 6 attached on the lower surface of the substrate 1.

To fabricate the package, the semiconductor chip 3 is attached to the upper central portion of the substrate 1 by the adhesive 2 in a die bonding process. Thereafter, in a wire bonding process, the chip pads 3a formed on the upper surface of the semiconductor chip 3 and the patters (not shown) formed on the substrate 1 are interconnected with the metal wires 4. In a molding process, the semiconductor chip 3, the metal wires 4, and a portion of the upper surface of the substrate 1 are encapsulated with epoxy, thus forming the molding section 5. In a solder ball attaching process, the solder balls 6 are attached to the lower surface of the substrate 1.

However, in he related BGA package, the substrate 1 requires a predetermined upper surface are and thickness. Further, the metal wires 4 must have a predetermined length to accommodate the height of a loop. Accordingly, it is not possible to fabricate a lighter and more compact package. In addition, the wire bonding process of interconnecting the chip pads 3a and the patterns (not shown) on the substrate 1 is very difficult to perform, and requires a significant amount of time. Accordingly, there is a limit to the productivity that can be achieved when making this type of BGA package.

SUMMARY OF THE INVENTION

Accordingly, it is an object of the present invention to overcome the aforementioned problems encountered in the related art.

It is another object of the present invention to provide a lighter and more compact package without using a substrate and metal wires.

It is another object of the present invention to enhance the productivity of the fabrication process. It is still another object of the present invention to eliminate a wire bonding step.

To achieve the above object, a BGA package embodying the invention includes a semibonductor chip, connection balls attached on upper surfaces of a plurality of chip pads formed on an upper surface of the semiconductor chip, a molding section exposing upper portions of the connection balls and encapsulating the semiconductor chip, and a plurality of solder balls attached on the exposed surfaces of the connection balls.

To achieve the above objects a fabrication method embodying the invention includes a ball formation step for attaching connections balls on upper surfaces of chip pads formed on an upper surface of a semiconductor chip, a molding step for molding an epoxy so that the connection balls and the semiconductor chip are encapsulated, thus forming a molding section, a grinding step for grinding an upper surface of the molding section so that upper surfaces of the connection balls are exposed, and a solder ball attaching step for attaching solder balls to the connection balls exposed from the upper surface of the molding section.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements, and wherein.

DETAILED DESCRIPTION OF PREFERRED EMBODIMENTS

Figure 1:
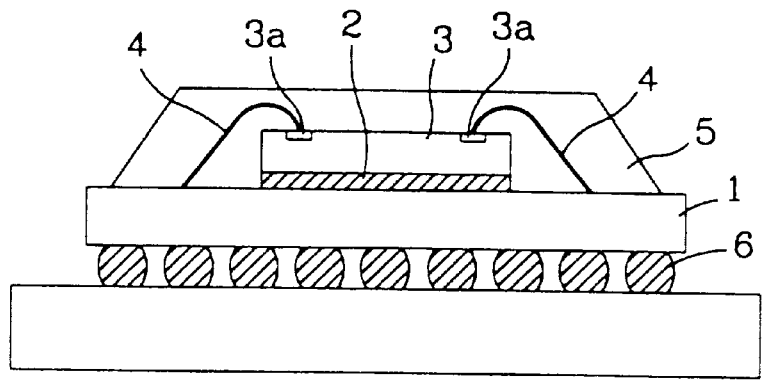
FIG. 1 is a cross-sectional view illustrating a related BGA package.
Figure 2:
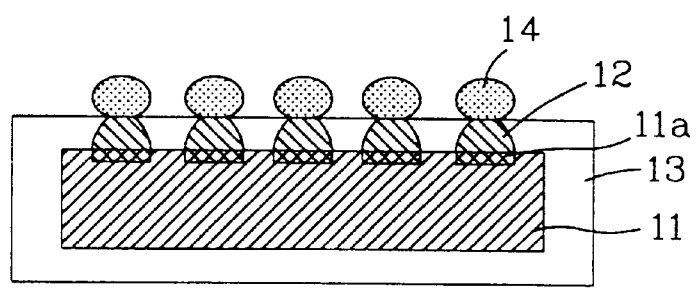
FIG. 2 is a cross-sectional view illustrating a BGA package according to a first embodiment of the present invention.

FIG. 2 illustrates a BGA package in accordance with a preferred embodiment of the present invention. The package includes a semiconductor chip 11 having a plurality of chip pads 11a. A plurality of connection balls 12 are connected to the chip pads 11a and a plurality of solder balls 14 are connected to the connection balls 12. A molding section 13 surrounds the chip. As can be appreciated, the molding section need not entirely surround the semiconductor chip.

Figure 3A:
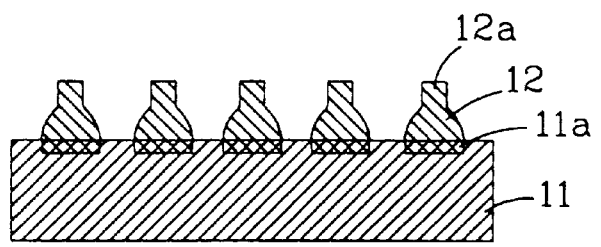
FIGS. 3A through 3D are cross-sectional views depicting a fabrication sequence of a BGA package according to the present invention.

To fabricate the package, connections balls 12 with metal connectors, e.g., metal wires 12a extending from their upper ends, are attached to upper surfaces of corresponding chip pads 11a formed on the upper surface of a semiconductor chip 11, as shown in FIG. 3A. This step is performed using a bonding apparatus. The metal wires 12a are preferably made of Au having a high conductivity. The processing of the metal wires 12a at each upper portion of the connection balls 12 is continuously performed by using a bonding apparatus.

Figure 3B:
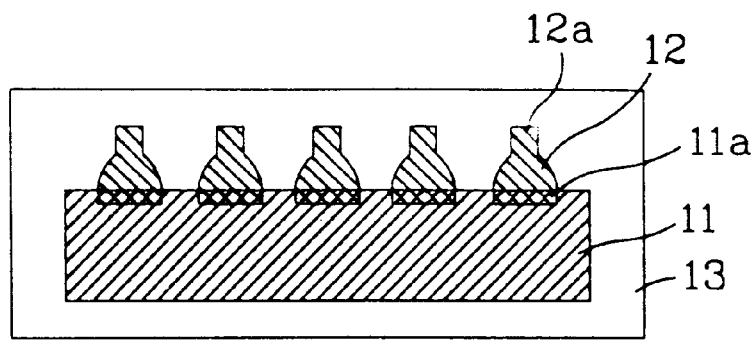

In a molding step, the semiconductor chip 11, to which the connection balls 12 are attached, is positioned inside a mold, and epoxy is injected through a portion of the mold, thus forming the molding section 13. The molding section 13 encapsulates the semiconductor chip 11 and the connection balls 12 as shown in FIG. 3B.

Figure 3C:
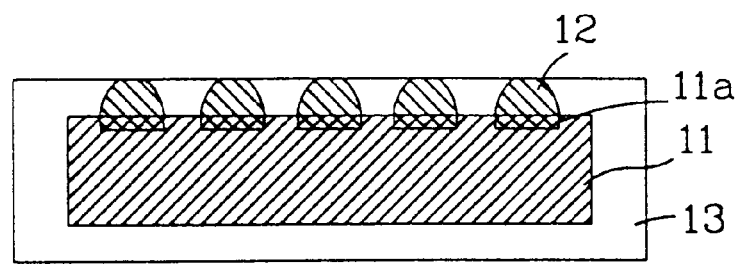

In a grinding step, portions of the metal wires 12a and the connection balls 12 are removed using a grinder. The grinding step exposes the upper surfaces of the connection balls 12, as shown in FIG. 3C.

Figure 3D:
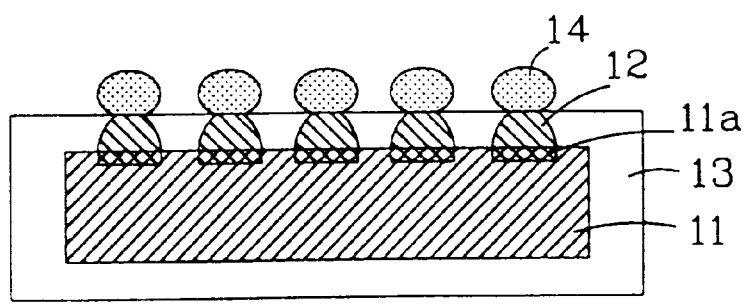

Next, in a solder ball attaching step, solder balls 14 are attached to the upper surfaces of the connection balls 12, as shown in FIG. 3D.

Figure 4:
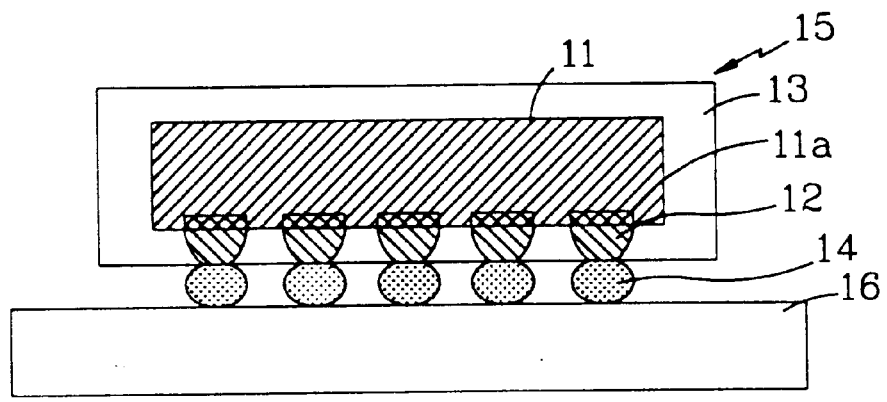
FIG. 4 is a cross-sectional view depicting a BGA package according to the present invention mounted on a circuit board.

FIG. 4 depicts the BGA package mounted on a mother board. As shown therein, the BGA package 15 is turned upside down, and is then aligned with conductive regions on the upper surface of a mother board 16. The mother board and BGA package are then processed in a furnace in a reflow step to attach the BGA package to the mother board.

Figure 5:
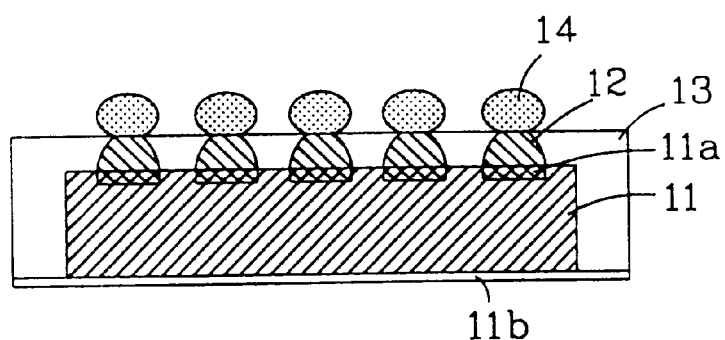
FIG. 5 is a cross-sectional view illustrating a BGA package according to a second embodiment of the present invention.

FIG. 5 illustrates a BGA package according to another embodiment of the present invention. The construction of the BGA package according to this embodiment of the present invention is similar to the previous embodiment, except that molding section 13 is formed such that the lower surface of the semiconductor chip 11 is exposed during the molding process. This allows heat to be radiated form the exposed surface of the semiconductor chip 11. When the heat generated during operation of the chip 11 is radiated both through the connection balls 12 and the solder balls 14, and also through the exposed lower surface 11b of the semiconductor chip 11, it is possible to maximize a heat radiating effect.

Figure 6:
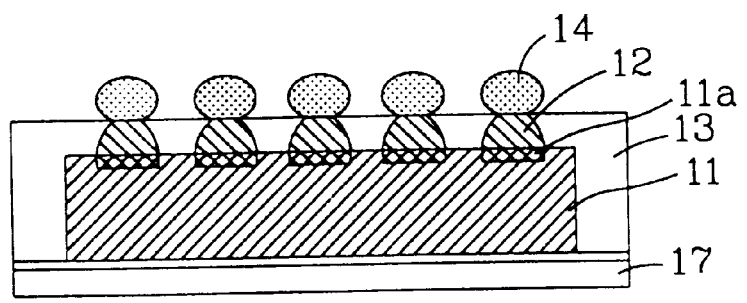
FIG. 6 is a cross-sectional view illustrating a BGA package according to a third embodiment of the present invention.

FIG. 6 illustrates a BGA package according to another embodiment of the present invention. As shown therein, the construction is similar to the previous embodiment in FIG. 5, except a heat spreader 17 is disposed on the lower surface of the semiconductor chip 11. Heat generated in the semiconductor chip 11 is easily radiated though the connection balls 12 and the solder balls 14 and through the heat spreader 17.

As described above, a BGA package and fabrication method therefor according to the present invention are directed to fabricating a lighter and more compact package by eliminating the use metal wires. In addition, it is possible to increase the productivity of the assembly process by eliminating the wire bonding step, which is a very complicated process that takes much time. Thus, the fabrication cost may also be reduced.

The foregoing embodiments are merely exemplary and are not to be construed as limiting the present invention. For example, in an alternative embodiment, the side surfaces of the semiconductor chip and/or the lower surface can be exposed and not molded by the molding section. The present teaching can be readily applied to other types of apparatus. The description of the present invention is intended to be illustrative, and not to limit the scope of the claims. Many alternatives, modifications, and variations will be apparent to those skilled in the art.

What is claimed is:

1. A method for fabricating a chip package, comprising the steps of:

attaching a plurality of conductive media to upper surfaces of corresponding chip pads formed on a chip;

molding an epoxy to package at least a portion of the chip and at least a portion of the conductive media, thus forming a molding section; and removing an upper surface portion of the molding section so that upper surfaces of the plurality of conductive media are exposed.

2. The method of claim 1, wherein the removing step comprises grinding the upper surface portion of the molding section and portions of said plurality of conductive media with a grinder.

3. The method of claim 2, wherein the molding step is performed so as to leave a lower surface of the semiconductor chip exposed.

4. The method of claim 3, further comprising the step of attaching a heat spreader to the exposed lower surface of the semiconductor chip.

5. The method of claim 1, further comprising a step of attaching a plurality of solder balls to the package, wherein the solder balls are attached to respective ones of the plurality of conductive media.

6. The method of claim 1, wherein the attaching step comprises attaching a plurality of conductive media made of Au to upper surfaces of the chip pads.

7. The method of claim 1, wherein each of said plurality of conductive media comprises a connection ball and a conductive wire, said conductive ball being coupled to a corresponding chip pad and said wire being removed during the removing step.

\* \* \* \* \*